United States Patent [19]

Kukanskis et al.

[11] Patent Number: 5,037,482

[45] Date of Patent: Aug. 6, 1991

[54] COMPOSITION AND METHOD FOR IMPROVING ADHESION OF COATINGS TO COPPER SURFACES

[75] Inventors: Peter E. Kukanskis, Woodbury; Barry H. Williams, Oxford; Thomas J. Carmody, Waterbury, all of Conn.

[73] Assignee: MacDermid, Incorporated, Waterbury, Conn.

[21] Appl. No.: 480,911

[22] Filed: Feb. 16, 1990

[51] Int. Cl.$^5$ ............................................. B08B 3/08
[52] U.S. Cl. ......................................... 134/3; 134/41; 156/656; 156/666; 252/79.1; 252/79.4
[58] Field of Search ................... 134/3, 41; 156/656, 156/666; 252/79.1, 79.4

[56] References Cited

U.S. PATENT DOCUMENTS

| | | | |
|---|---|---|---|
| 4,921,571 | 5/1990 | Kukanskis et al. | 156/656 |
| 4,944,851 | 7/1990 | Cordani et al. | 134/3 |
| 4,957,653 | 9/1990 | Cordani | 134/3 |

*Primary Examiner*—Asok Pal
*Attorney, Agent, or Firm*—St. Onge Steward Johnston & Reens

[57] ABSTRACT

A composition for cleaning and improving the adhesion characteristics of a copper surface (which is in turn adhered to an underlying substrate) so as to enable a coating, e.g., of photoresist, to be adhered easily and completely to the copper surface, the cleaning and adhesion promoting composition consisting essentially of an aqueous solution of an alkane sulfonic acid, a surfactant and an oxidizing agent of a type, and present in an amount, sufficient to provide controlled conversion of the copper surface to a substantially clean, microroughened surface, without removing the copper surface from the underlying substrate, so that the adhesion characteristics of the copper surface are substantially increased for receiving and securely adhering a subsequently applied coating.

11 Claims, 2 Drawing Sheets

COMPOSITION AND METHOD FOR IMPROVING ADHESION OF COATINGS TO COPPER SURFACES

BACKGROUND OF THE INVENTION

The present invention relates to improving the adhesion characteristics of a copper surface to enable subsequently applied coatings to be completely and easily adhered to the copper surface and, more particularly, to an improved cleaning and adhesion promoter composition and method for treating the surface of copper foil laminates used in printed circuits to improve the adhesion of subsequently applied coatings affixed to the copper surface.

The composition of the invention removes contaminants from the copper surface (which in turn is adhered to an underlying substrate) and enhances the surface topography thereof by controlled conversion of the copper surface from a relatively smooth surface to a micro-roughened surface, through a microetching which removes, e.g., from about 0.5 to 5 microns of the copper. In this way, a copper foil laminate for use as a printed circuit board is provided with improved adhesion characteristics to enable subsequently applied photoresist or oxide coatings to more easily and completely adhere to the copper surface. More particularly, the invention relates to an improved cleaning and adhesion promoter composition which is capable of concurrently bringing about both cleaning and microetching of the copper surface to improve the adhesion characteristics of the copper surface prior to the application of photoresist or oxide coatings to the copper surface in the manufacture of printed circuit boards.

In a typical preparation of printed circuits, a copper foil is bonded to an insulating substrate which may be phenolic, epoxy, polyimide, polyester, or the like. The foil is normally treated electrolytically to provide a specific surface structure, such as disclosed in U.S. Pat. Nos. 3,293,109; 3,318,758; 3,518,168; 4,049,481; 4,131,517; 4,176,035; and others.

Multilayer printed circuit boards are assemblies containing several copper foil-clad substrate inner-layers, further bonded to each other through layers of semi-cured polymeric material, which are subsequently cured at elevated temperatures and pressures to form the complete laminate assembly. Prior to this assembly, the copper foil of the innerlayers is imaged and etched to form the innerlayer circuits of the assembly.

The printed circuit board industry is continuously faced with an increasing demand for higher density circuitry. This has led to the production of finer lines of circuitry and is leading toward the use of thinner and thinner copper foils. As this trend continues, the preparation of the innerlayer copper foil becomes increasingly more critical. The use of thinner foils requires much tighter processing controls in order to produce uniform circuitry.

Combining the steps of initially cleaning and preparing a copper surface adhered to an underlying substrate to improve the adhesion characteristics of the copper surface for easily and completely affixing subsequently applied coatings would reduce the labor involved as well as the time to process the circuit boards. Thus, the final cost of manufacturing each board would be reduced.

While the present invention is particularly apropos of printed circuit board manufacture, and more particularly innerlayers of multilayered circuit boards, the need to remove contaminants from copper surfaces and to improve the adhesion characteristics of copper surfaces so that subsequently applied coatings will be more completely adhered to the copper surface also arises in other contexts where a contaminant-free surface with adhesion-improved characteristics of the copper surface is needed for subsequent plating operations for decorative or functional purposes.

PRIOR ART

Preparing copper innerlayer laminates previously involved several process steps to ensure a clean copper foil surface prior to application of photoresist and/or oxide coatings. The processes used in industry include a pumice or mechanical scrub usually followed by a chemical treatment of peroxide/sulfuric, or persulfate. Such processes have their own inherent problems: for example, when pumice is used there is pumice entrapment in the copper foil, or in the case of mechanical scrubbing with nylon brushes, gouging of the foil surfaces results. In addition, thinner innerlayer materials are susceptible to other defects and damage from aggressive mechanical surface scrubbing, such as distortion and incomplete treatment of copper surfaces due to worn scrubbers or plugged nozzles. The subsequent chemical treatment cannot overcome the damage done to the foil by these mechanical methods. Also, the regular chemical treatments are not effective in removing the chromate films on the foil that may remain after scrubbing, thereby resulting in a poor surface topography for the adhesion of the subsequently applied photoresist and/or oxide coatings.

In order to avoid some of the damaging effects of scrubbing, some manufacturers use a chemical cleaning method. In this instance the laminate is processed in an alkaline or acid cleaner traditionally known in the art, followed by a conventional chemical treatment (e.g., peroxide/sulfuric acid as above noted). The cleaners have the ability to remove the handling soils, fingerprints and oils that may be present on the laminate, but usually have little effect on the chromate film on the copper foils present from the lamination process. Again, the chemical treatment only partially removes the chromate film on the copper surface which in turn produces a less than satisfactory application of the subsequently applied photoresist or oxide coating because it does not adhere properly to the copper surface at the places where the chromate film residue remains.

SUMMARY OF THE INVENTION

A primary object of the present invention is to provide a composition useful for treating a copper surface, adhered to an underlying substrate, by removing contaminants from the copper surface and improving the adhesion characteristics of the copper surface to enable subsequently applied coatings to be more easily and completely adhered to the copper surface.

Another object of the invention is to provide a composition for concurrently removing contaminants from a copper surface, adhered on an underlying substrate, and for enhancing the surface topography of the copper surface of the laminate by controlled conversion of the substantially smooth copper surface to a substantially micro-roughened topography, thereby improving the adhesion characteristics of the copper surface for subsequently applied coatings.

Yet another object of the invention is to provide a composition for removing contaminants such as chromate and/or triazole tarnish inhibitor films as well as handling soils from a copper surface while concurrently treating the topography of the copper surface to achieve enhanced adhesion characteristics of the copper surface so that subsequently applied photoresist or oxide coatings are completely adhered to the copper surface.

Still another object of the invention is the provision of a composition of the type described which effects, in a single application step, the removal of contaminants from a copper surface and roughens the surface topography of the copper surface to provide better adhesion characteristics of the copper surface to insure that subsequently applied photoresist or oxide coatings are completely adhered to the copper surface.

Another object of the invention is the provision of a cleaning and adhesion promoter composition of the type described which can be applied by the techniques of immersion or spraying, and which employs ingredients that are environmentally sound.

These and other objects are achieved by the provision in the present invention of a composition and method for treating a copper surface, which is in turn adhered to an underlying substrate, the composition consisting essentially of an aqueous solution of an alkane sulfonic acid, a surfactant, and an oxidizing agent of a type, and present in an amount, to provide in cooperating interaction with the surfactant a cleaning of the copper surface and a controlled conversion of the copper surface from a substantially smooth surface to a substantially micro-roughened surface topography so that the copper surface has increased adhesion characteristics for coatings subsequently applied to the copper surface and without removing said copper surface from the underlying substrate. In the preferred embodiment, the composition consists essentially of between about 5% and 60% by weight of the alkane sulfonic acid, between about 0.01% and 50% by weight of the oxidizer, and between about 0.001% and 10% by weight of the surfactant.

In the preferred embodiment of the invention, the alkane sulfonic acid comprises methane sulfonic acid, the oxidizer comprises ferric nitrate, and the surfactant comprises a nonionic and/or anionic surfactant.

The foregoing composition is effective not only in removing soils and the like (e.g., the chromate and/or triazole tarnish inhibitor films present on copper foil-clad substrates by reason of the copper foil lamination process), but concurrently also in roughening the surface by converting the substantially smooth copper surface to a substantially uniformly micro-roughened copper surface by means of a microetching of from about 0.5 to 5 microns of the copper thickness to enhance the adhesion characteristics of the copper surface for the subsequent application thereto of coatings such as photoresist or oxide coatings.

DETAILED DESCRIPTION OF THE INVENTION

Figure 1:
FIG. 1 is an electron-microscope-generated photograph showing the surface of copper foil before being treated by the cleaning adhesion promoter composition at a magnification of 5000× and at a 45° angle to surface to show the surface topography.

In accordance with the present invention, a combination cleaner and adhesion promoter composition is provided to act as a pretreatment for a copper surface adhered to an underlying substrate so as to remove contaminants such as soils, fingerprints, triazole tarnish inhibitor and chromate films from the surface of the copper and to provide improved surface topography on the copper surface which will improve the bonding of any subsequently applied photoresists (i.e., both liquid or dry-film type) or oxide coatings to the copper surface.

This cleaning and adhesion promoting composition performs two functions simultaneously when applied to the copper surface adhered to an underlying substrate. First it cleans the copper surface being treated by removing any contaminants on the surface, such as for example soils, fingerprints, triazole tarnish inhibitor, chromate films, and the like. Then, it converts the substantially smooth copper surface through a controlled reaction to a substantially uniformed micro-roughened surface topography to thereby further improve the bonding adhesion characteristics of the treated copper surface to enable subsequently coatings to be easily and completely adhered to the copper surface. Examples of subsequently applied coatings used in the manufacturing of printed circuit boards are photoresists (i.e. both liquid or dry film type) and/or oxide coatings. A copper foil laminate is but one example of a copper surface that may be so treated by this cleaning and adhesion promoting composition.

The cleaner/adhesion promoter is composed of water, alkane sulfonic acid (generally either methane or ethane sulfonic acid), an oxidizing agent for copper, and specific surfactants. The alkane sulfonic acid is used from about 5% to about 60% by weight of the composition, preferably from about 15% to about 40% by weight. The oxidizer can range from about 0.1% to about 50% by weight of the composition, preferably from about 1% to about 15% by weight, and most preferably from about 5% to about 10% by weight, all of course depending upon the type of oxidizing agent employed. The oxidizers can include ferric nitrate, peroxide, ferric chloride, and copper chloride, with ferric nitrate preferred. The surfactants range from about 0.001% to about 10% by weight of the composition, preferably from about 0.01% to about 3% by weight. The surfactants alone or in combination, preferably encompass nonionic and anionic surfactants. Examples of nonionic surfactants include without limitation: ethoxylated nonyl- and octylphenols of ethylene oxide from 3 to 30 moles of ethylene oxide, preferably 3.5 moles, and modified polyethoxylated straight chain alcohols as are available under tradename Triton DF-16 from Rohm & Haas; alkyl polyoxyalkylene ether, e.g. Mazawet DF from Mazer Chemical; and block copolymers of ethylene oxide and propylene oxide such as Pluronic 31R1 from BASF. Anionic surfactants include without limitation: sulfonated aryl and alkyl hydrocarbons such as Petro BA from Desoto, Inc.; sulfated aryl and alkyl hydrocarbons such as Sipon BOS from Alcolac, Inc.; and phosphate esters such as Triton H-66 from Rohm & Haas.

The cleaner/adhesion promoter composition is generally used at a temperature ranging from about ambient to about 130° F. with a preferable range being from 80° F. to 95° F., from a contact time of from about 10 seconds to 10 minutes, preferably from 30 seconds to 5 minutes. When the composition is used with peroxide, ferric chloride or copper chloride as the oxidizer, these materials are consumed in the reaction which remove copper from the copper surface. Thus, using these compounds necessitates regular additions of the oxidizers to maintain continuous operation. When ferric nitrate is used, the oxidizer is lost only by drag-out. It is theorized that upon reacting and removing copper from the copper surface, the iron is re-oxidized from ferrous to ferric and is available to again remove more copper. Thus, the only limiting factor in the cleaner/adhesion promoter in this regard is its capacity to hold copper in solution.

The oxidizer must be of a type, and present in an amount, sufficient to provide in cooperating interaction with the surfactant, a controlled conversion of the copper surface from a substantially smooth surface to a substantially clean, substantially uniformly micro-roughened surface, so that the bonding characteristics of the copper surface are substantially increased for securely adhering a subsequently applied coating to the copper surface, without at the same time removing the copper surface itself from the underlying substrate to which it is adhered. An oxidizing agent which is too active, and/or which is used in too substantial concentrations, not only runs the risk of uncontrolled stripping of the copper surface from its underlying substrate, but more importantly has been found ineffective to produce the required micro-roughened topography on the remaining copper surface. Results such as this have been found with compositions containing nitric acid as the oxidizer. Even where complete stripping is avoided, the remaining copper surface is nevertheless surprisingly smooth and unacceptable for promoting adhesion of subsequently applied coatings.

The cooperating interaction of a suitable oxidizer, used in suitable amount, along with the surfactant, provides a controlled cleaning and conversion of the substantially smooth copper surface to a substantially micro-roughened, clean surface, with between about 0.5 and 5 microns of the original copper surface being removed. This micro-roughening provides increased surface area, thereby improving the bonding characteristics of the treated copper surface, especially to subsequently applied coatings.

The alkane sulfonic acid in the cleaner/adhesion promoter composition according to the present invention is selected from any one or more compounds having the formula $RSO_3H$, where R is a lower alkyl group having from 1 to 5 carbon atoms, and preferably 1 or 2 carbon atoms, i.e., methane sulfonic acid or ethane sulfonic acid, with methane sulfonic acid most preferred.

The amount of alkane sulfonic acid employed in the aqueous compositions is preferably in an amount ranging from 3% to 45% by volume, more typically 10% to 40% by volume, and most typically 25% to 30% by volume, based upon a 70% methane sulfonic acid aqueous solution, which is a form in which methane sulfonic acid is commonly sold. Obviously, however, other concentrations, and the anhydrous form of the acid, can be used in making up the composition.

The present invention also affords a means for regenerating the bath per se or any removed portion thereof both to recover metal values and to reestablish operating concentrations of the alkane sulfonic acid.

BEST MODE

As indicated earlier, the composition of the invention provides for the removal of contaminants, such as dirt, soils and chromate and thiazole tarnish inhibitors, from the copper surface and provides a fine uniform etch with good topography to enhance photoresist or oxide adhesion to the surface of the copper. For one ounce copper-clad innerlayers (.0014 inches of copper), best results occur when the composition effects removal of from between 0.5 microns (0.00001 in) to 5 microns (0.0002 in) of the copper. The composition may be applied by immersion, spraying or other modes.

Not only are the contaminants removed from the surface of the copper foil but the copper surface topography itself undergoes a change—that is, the substantially smooth surface is micro-roughened by a controlled conversion to a substantially clean, substantially uniformly roughened surface topography. Compare FIGS. 1 and 2. Note that in FIG. 2 the number and magnitude of the irregularities on the copper surface is increased using the composition of the invention. Such action increases the surface area of the copper available for bonding and thus promotes better adhesion to the copper surface of a subsequently applied coating.

The following examples will further illustrate the best mode of operation.

EXAMPLE 1

A 7 mil core, 1 oz. copper laminated epoxy innerlayer was processed through an immersion cleaner/micro-etch prior to dry-film photoresist lamination. The process using the steps set forth below was as follows:

(1) Cleaner/adhesion promoter, for 3 minutes at 95° F.
(2) Two cold water rinses
(3) Hot water rinse
(4) Hot air dry
(5) Dry-film lamination
(6) Image
(7) Develop
(8) Alkaline etch - Ultra Etch FL for 45 seconds at 120° F.
(9) Cold water rinse
(10) Dry The cleaner/adhesion promoter used in step (1) above contained the following:

| | |
|---|---|
| Water | 57.325% by weight |
| Methane Sulfonic Acid (70%) | 35.0% by weight |
| Ferric Nitrate | 7.5% by weight |
| Mazawet DF | 0.05% by weight |
| Triton DF-16 | 0.075% by weight |
| Petro BA | 0.05% by weight |

The amount of copper removed was approximately 1.25 microns (0.00005 inches) from the copper foil surface.

Figure 2:
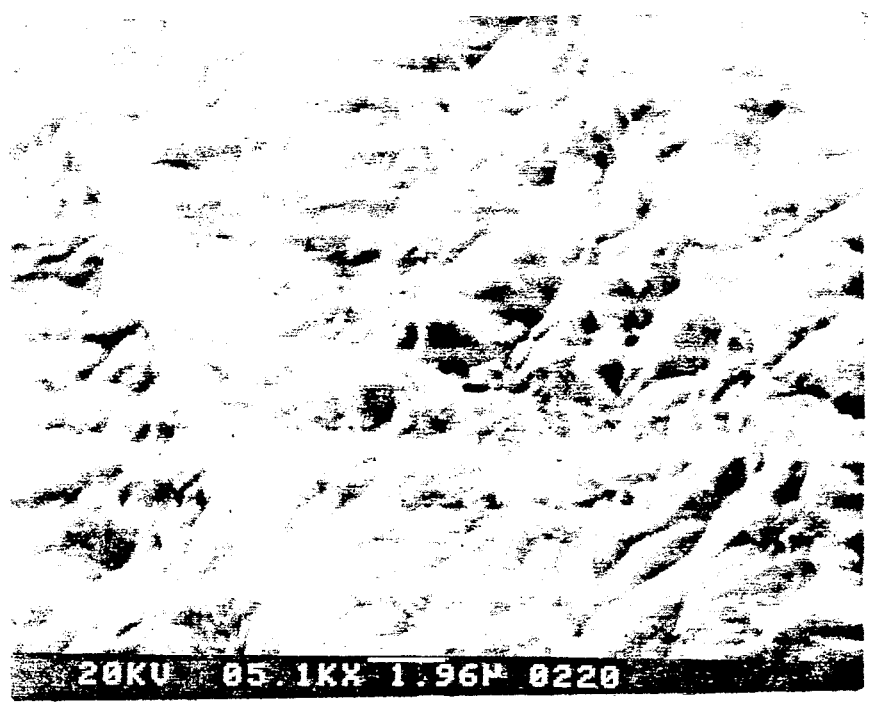
FIG. 2 is an electron-microscope-generated photograph at the same magnification and at a 45° angle to surface as FIG. 1, showing the surface topography of copper foil after being treated by the method of this invention as set forth in Example 1.

Upon inspection after the alkaline etching of the 1 oz. of copper in non-resist areas to define the innerlayer circuitry, no lifting of the photoresist was evident. The surface of the foil before and after treatment with the cleaner/micro-etch is shown in the electron-microscope-generated photographs labeled FIGS. 1 and 2, respectively. The micro-roughened surface with numerous deep irregularities and an average vertical depth penetration of 1.25 microns is shown in FIG. 2 as contrasted with the untreated copper surface of FIG. 1 which is substantially smooth and has a relatively even and unbroken copper surface topography.

EXAMPLE 2

The same process as used in Example 1 was utilized and repeated except that the cleaner/adhesion formulation was as follows (i.e., no surfactants were employed):

| Water | 57.5% by weight |
|---|---|
| Methane Sulfonic Acid 70% | 35.0% by weight |
| Ferric Nitrate | 7.5% by weight |

Inspection of the laminate prior to dry-film lamination showed a splotchy copper surface indicative of unevenness of the surface topography. Inspection after dry-film and alkaline etch revealed an undesirable lifting of the dry-film in areas corresponding to the location of the splotchy areas on the copper foil surface.

EXAMPLE 3 (PRIOR ART)

The process as used in Example 1 was repeated, but the etchant solution used was that described by Nelson in his U.S. Pat. No. 4,632,727 (Example 3) having the following formulation:

| Distilled Water | 1100 cc |
|---|---|
| Methane Sulfonic Acid 70% | 1000 cc |
| Nitric Acid 70% | 900 cc |
| Reten 520 (2% solution) (A Hercules Polyacrylamide) | 100 cc |
| Varion H.C. (A Sherex Chemical Surfactant) | 5 cc |

Figure 3:
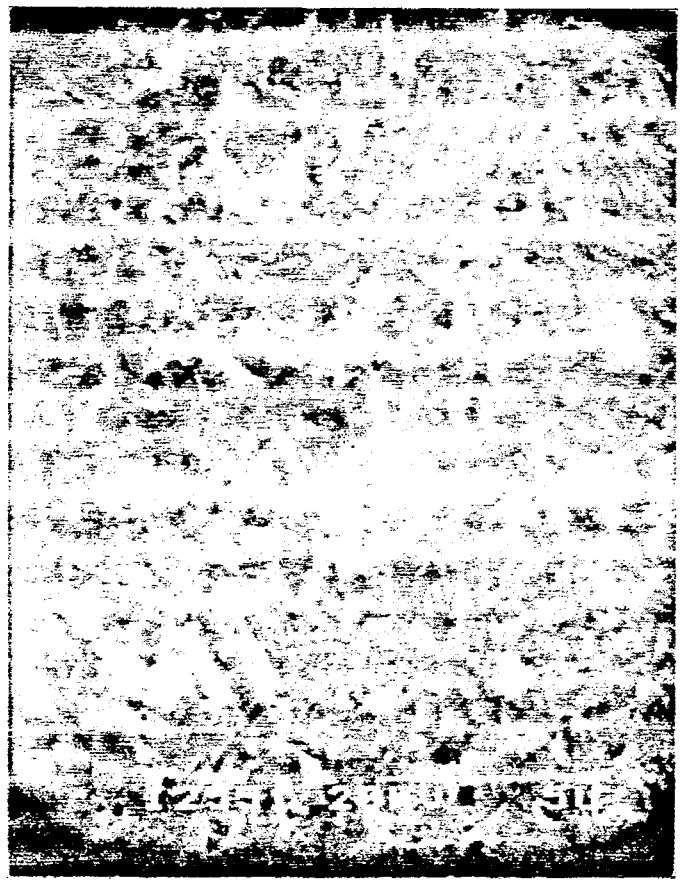
FIG. 3 is an electron-microscope-generated photograph at a magnification of 4500× and at a 45° angle to surface showing the surface topography of copper foil treated by a prior art method according to Example 3 of U.S. Pat. No. 4,632,727.

This etchant solution was used at 95° F. (approx. 34° C.) versus 45° C. as indicated in the Nelson patent. The time of etching was reduced to 24 seconds. The action of this composition was very aggressive, but did not provide a proper topography of the copper surface. FIG. 3 shows the unacceptable smooth topography resulting from this treatment, while FIG. 2 shows the preferred enhanced substantially micro-roughened surface topography resulting from the application of the cleaner/adhesion promoter composition of the invention.

The above description is for the purpose of teaching a person of ordinary skill in the art how to practice the invention. This description is not intended to detail all of the obvious modifications and variations of the invention that will become apparent to the skilled worker upon reading. However, it is intended that all such modifications and variations be included within the scope of the invention which is defined by the following claims.

We claim:

1. A process for cleaning and improving the adhesion characteristics of a copper surface, adhered to an underlying substrate, for enabling a subsequently applied coating to be easily and completely adhered to the copper surface, said process comprising contacting said copper surface with a composition consisting essentially of water, an alkane sulfonic acid, a surfactant, and an oxidizing agent for copper, said oxidizing agent being of a type, and present in an amount, sufficient to provide, in cooperating interaction with the surfactant, and under the conditions and time of said contacting, controlled conversion of the copper surface to a substantially clean, substantially uniformly micro-roughened surface without etching said copper surface from said underlying substrate, whereby the adhesion characteristics of said copper surface are substantially increased for receiving and securely adhering a subsequently applied coating thereto.

2. The process according to claim 1, wherein said alkane sulfonic acid is present in an amount of from about 5% to 60% by weight; said oxidizer is present in an amount of from about 0.1% to 60% by weight; and said surfactant is present in an amount of from about 0.001% and 10% by weight.

3. The process according to claim 2 wherein said surfactant is a mixture of nonionic and anionic surfactants.

4. The process according to claim 1, wherein said nonionic surfactant is selected from the group consisting of ethoxylated nonylphenols and octylphenols and alcohols of ethylene oxide, alkyl polyoxyalkylene ether, and block copolymers of ethylene and propylene oxide; and the anionic surfactant is selected from the group consisting of sulfonated aryl and alkyl hydrocarbons, sulfated aryl and alkyl hydrocarbons, and phosphate esters.

5. A process for cleaning and improving the adhesion characteristics of a copper surface adhered to an underlying substrate, for enabling a subsequently applied coating to be easily and completely adhered to the copper surface, said process comprising, contacting said copper surface with a composition consisting essentially of water, methane sulfonic acid, ferric nitrate, and a surfactant mixture of ethoxylated nonyl- and octylphenols and alcohols of ethylene oxide, alkyl polyoxyalkylene ether, and sulfonated aryl and alkyl hydrocarbons, for a time and at conditions effective to provide a controlled conversion of the copper surface to a substantially clean, substantially uniformly micro-roughened surface topography without removing said copper surface from said underlying substrate.

6. A process according to claim 5 wherein said composition consists essentially of water, between about 15%-40% by weight of an alkane sulfonic acid selected from the group consisting of methane sulfonic acid and ethane sulfonic acid; between about 1%-15% by weight of an oxidizer selected from the group consisting of ferric nitrate, peroxide, ferric chloride, and copper chloride; and between about 0.01%-3% by weight of a surfactant selected from the group consisting of nonionic surfactants and anionic surfactants, and mixtures thereof.

7. A process according to claim 6 wherein said composition consists essentially of water, about 35% by weight of an methane sulfonic acid (70%), about 7.5% by weight of ferric nitrate, and about 1.75% by weight of a surfactant mixture of ethoxylated nonyl- and octylphenols and alcohols of ethylene oxide, alkyl polyoxyalkylene ether, and sulfonated aryl and alkyl hydrocarbons.

8. The process according to claim 3 wherein said step of contacting said surface with said composition is achieved by immersing said copper surface in said composition.

9. The process according to claim 3 wherein said step of contacting said surface with said composition is achieved by spraying said composition onto said copper surface.

10. The process according to claim 3 wherein said copper surface is a copper-clad printed circuit board substrate.

11. The process according to claim 10 wherein said subsequently applied coating is selected from the group consisting of photoresist and oxide coatings.

* * * * *